United States Patent
Khlat et al.

(10) Patent No.: US 11,165,412 B2
(45) Date of Patent: Nov. 2, 2021

(54) ZERO-OUTPUT COUPLED RESONATOR FILTER AND RELATED RADIO FREQUENCY FILTER CIRCUIT

(71) Applicant: Qorvo US, Inc., Greensboro, NC (US)

(72) Inventors: Nadim Khlat, Cugnaux (FR); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 302 days.

(21) Appl. No.: 16/358,823

(22) Filed: Mar. 20, 2019

(65) Prior Publication Data

US 2019/0222197 A1 Jul. 18, 2019

Related U.S. Application Data

(63) Continuation-in-part of application No. 15/883,933, filed on Jan. 30, 2018.
(Continued)

(51) Int. Cl.
*H03H 9/58* (2006.01)
*H03H 9/52* (2006.01)
(Continued)

(52) U.S. Cl.
CPC ............ *H03H 9/584* (2013.01); *H03H 9/205* (2013.01); *H03H 9/52* (2013.01); *H03H 9/568* (2013.01);
(Continued)

(58) Field of Classification Search
CPC .......... H03H 9/205; H03H 9/52; H03H 9/568; H03H 9/584; H03H 9/589; H03H 9/605;
(Continued)

(56) References Cited

U.S. PATENT DOCUMENTS 3,731,230 A 5/1973 Cerny, Jr.
3,875,533 A 4/1975 Irwin et al.
(Continued)

FOREIGN PATENT DOCUMENTS

JP 2012257050 A 12/2012

OTHER PUBLICATIONS

Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
(Continued)

*Primary Examiner* — Barbara Summons
(74) *Attorney, Agent, or Firm* — Withrow & Terranova, PLLC

(57) ABSTRACT

A zero-output coupled resonator filter (ZO-CRF) and related radio frequency (RF) filter circuit are provided. In examples discussed herein, the ZO-CRF can be configured to function as a shunt resonator(s) in an RF filter circuit (e.g., a ladder filter circuit). The ZO-CRF includes a first resonator and a second resonator that are coupled to each other via a coupling layer. The first resonator and the second resonator receive a first voltage and a second voltage, respectively. The first voltage and the second voltage can be configured in a number of ways to cause the ZO-CRF to resonate at different resonance frequencies. As such, it may be possible to modify resonance frequency of the ZO-CRF in an RF filter circuit based on signal connection. As a result, it may be possible to reduce total inductance of the RF filter circuit, thus helping to reduce footprint of the RF filter circuit.

18 Claims, 13 Drawing Sheets

Related U.S. Application Data

(60) Provisional application No. 62/451,915, filed on Jan. 30, 2017.

(51) Int. Cl.
  *H03H 9/205* (2006.01)
  *H03H 9/56* (2006.01)
  *H03H 9/02* (2006.01)

(52) U.S. Cl.
  CPC ... *H03H 9/589* (2013.01); *H03H 2009/02188* (2013.01)

(58) Field of Classification Search
  CPC ....... H03H 9/0095; H03H 2009/02188; H03H 2009/02196; H03H 2009/02204
  USPC .................. 333/188, 189, 192; 310/365, 366
  See application file for complete search history.

(56) References Cited

U.S. PATENT DOCUMENTS

| | | | |
|---|---|---|---|
| 4,442,434 A | 4/1984 | Baekgaard | |
| 4,577,168 A | 3/1986 | Hartmann | |
| 5,291,159 A | 3/1994 | Vale | |
| 6,067,391 A | 5/2000 | Land | |
| 6,670,866 B2 | 12/2003 | Ellaet et al. | |
| 6,714,099 B2 | 3/2004 | Hikita et al. | |
| 6,720,844 B1 | 4/2004 | Lakin | |
| 6,927,649 B2 | 8/2005 | Metzger et al. | |
| 6,927,651 B2 | 8/2005 | Larson, III et al. | |
| 6,975,183 B2 | 12/2005 | Aigner et al. | |
| 7,057,478 B2 | 6/2006 | Korden et al. | |
| 7,173,504 B2 | 2/2007 | Larson, III et al. | |
| 7,239,067 B2 | 7/2007 | Komuro et al. | |
| 7,321,183 B2 | 1/2008 | Ebuchi et al. | |
| 7,342,351 B2 | 3/2008 | Kubo et al. | |
| 7,367,095 B2 | 5/2008 | Larson, III et al. | |
| 7,391,285 B2 | 6/2008 | Larson, III et al. | |
| 7,436,269 B2 | 10/2008 | Wang et al. | |
| 7,515,018 B2 | 4/2009 | Handtmann et al. | |
| 7,804,374 B1 | 9/2010 | Brown et al. | |
| 7,825,749 B2 | 11/2010 | Thalhammer et al. | |
| 7,855,618 B2 | 12/2010 | Frank et al. | |
| 7,889,024 B2 | 2/2011 | Bradley et al. | |
| 7,898,493 B1 | 3/2011 | Rojas et al. | |
| 7,956,705 B2 | 6/2011 | Meister et al. | |
| 7,973,620 B2 | 7/2011 | Shirakawa et al. | |
| 8,248,185 B2 | 8/2012 | Choy et al. | |
| 8,508,315 B2 | 8/2013 | Jamneala et al. | |
| 8,575,820 B2 | 11/2013 | Shirakawa et al. | |
| 8,576,024 B2 | 11/2013 | Erb et al. | |
| 8,923,794 B2 | 12/2014 | Aigner | |
| 8,981,627 B2 | 3/2015 | Sakuma et al. | |
| 8,991,022 B2 | 3/2015 | Satoh et al. | |
| 9,054,671 B2 | 6/2015 | Adkisson et al. | |
| 9,054,674 B2 | 6/2015 | Inoue et al. | |
| 9,197,189 B2 | 11/2015 | Miyake | |
| 9,243,316 B2 | 1/2016 | Larson, III et al. | |
| 9,484,883 B2 | 11/2016 | Nishizawa et al. | |
| 9,698,756 B2 | 7/2017 | Khlat et al. | |
| 9,837,984 B2 | 12/2017 | Khlat et al. | |
| 9,847,769 B2 | 12/2017 | Khlat et al. | |
| 9,887,686 B2 | 2/2018 | Kuwahara | |
| 9,929,716 B2 | 3/2018 | Lee et al. | |
| 10,009,001 B2 | 6/2018 | Jiang et al. | |
| 10,141,644 B2 | 11/2018 | Khlat et al. | |
| 2002/0109564 A1 | 8/2002 | Tsai et al. | |
| 2004/0100342 A1 | 5/2004 | Nishihara et al. | |
| 2005/0057117 A1 | 3/2005 | Nakatsuka et al. | |
| 2005/0093648 A1 | 5/2005 | Inoue | |
| 2005/0206476 A1 | 9/2005 | Ella et al. | |
| 2006/0091978 A1 | 5/2006 | Wang et al. | |
| 2008/0007369 A1 | 1/2008 | Barber et al. | |
| 2008/0169884 A1* | 7/2008 | Matsumoto ............ H03H 9/585 333/187 |
| 2008/0297278 A1 | 12/2008 | Handtmann et al. | |
| 2009/0096549 A1 | 4/2009 | Thalhammer et al. | |
| 2009/0096550 A1 | 4/2009 | Handtmann et al. | |
| 2010/0277237 A1 | 11/2010 | Sinha et al. | |
| 2011/0115334 A1 | 5/2011 | Konishi et al. | |
| 2011/0121689 A1 | 5/2011 | Grannen et al. | |
| 2011/0204995 A1 | 8/2011 | Jamneala et al. | |
| 2011/0210787 A1 | 9/2011 | Lee et al. | |
| 2012/0007696 A1 | 1/2012 | Pang et al. | |
| 2012/0187799 A1 | 7/2012 | Nakahashi | |
| 2012/0313725 A1 | 12/2012 | Ueda et al. | |
| 2013/0033150 A1 | 2/2013 | Bardong et al. | |
| 2013/0113576 A1 | 5/2013 | Inoue et al. | |
| 2013/0193808 A1 | 8/2013 | Feng et al. | |
| 2014/0132117 A1 | 5/2014 | Larson, III | |
| 2014/0145557 A1 | 5/2014 | Tanaka | |
| 2014/0167565 A1 | 6/2014 | Iwamoto | |
| 2015/0222246 A1 | 8/2015 | Nosaka | |
| 2015/0280100 A1 | 10/2015 | Burak et al. | |
| 2015/0369153 A1 | 12/2015 | Tsunooka et al. | |
| 2016/0028364 A1 | 1/2016 | Takeuchi | |
| 2016/0056789 A1 | 2/2016 | Otsubo et al. | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0261235 A1 | 9/2016 | Ortiz | |
| 2016/0268998 A1 | 9/2016 | Xu et al. | |
| 2016/0308576 A1 | 10/2016 | Khlat et al. | |
| 2016/0359468 A1 | 12/2016 | Taniguchi et al. | |
| 2017/0093369 A1 | 3/2017 | Khlat et al. | |
| 2017/0093370 A1 | 3/2017 | Khlat et al. | |
| 2017/0141757 A1 | 5/2017 | Schmidhammer | |
| 2017/0201233 A1 | 7/2017 | Khlat | |
| 2017/0301992 A1 | 10/2017 | Khlat et al. | |
| 2017/0324159 A1 | 11/2017 | Khlat | |
| 2017/0338795 A1 | 11/2017 | Nakagawa et al. | |
| 2018/0013402 A1 | 1/2018 | Kirkpatrick et al. | |
| 2018/0041191 A1 | 2/2018 | Park | |
| 2018/0076793 A1 | 3/2018 | Khlat et al. | |
| 2018/0076794 A1 | 3/2018 | Khlat et al. | |
| 2018/0109236 A1 | 4/2018 | Konoma | |
| 2018/0109237 A1 | 4/2018 | Wasilik et al. | |
| 2018/0145658 A1 | 5/2018 | Saji | |
| 2018/0219530 A1 | 8/2018 | Khlat et al. | |
| 2018/0241418 A1 | 8/2018 | Takamine et al. | |
| 2018/0358947 A1 | 12/2018 | Mateu et al. | |
| 2019/0140618 A1 | 5/2019 | Takamine | |
| 2019/0181835 A1* | 6/2019 | Timme ............... H03H 11/1291 |
| 2019/0199320 A1 | 6/2019 | Morita et al. | |
| 2019/0207583 A1 | 7/2019 | Miura et al. | |
| 2019/0288664 A1 | 9/2019 | Saji | |
| 2019/0305752 A1 | 10/2019 | Sadhu et al. | |

OTHER PUBLICATIONS

Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.

Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.

Notice of Allowance and Examiner-Initiated Interview Summary for U.S. Appl. No. 16/003,417, dated Aug. 5, 2020, 9 pages.

Final Office Action for U.S. Appl. No. 16/290,175, dated Sep. 17, 2020, 13 pages.

Final Office Action for U.S. Appl. No. 15/883,933, dated Oct. 23, 2020, 15 pages.

Non-Final Office Action for U.S. Appl. No. 14/757,587, dated Sep. 13, 2016, 12 pages.

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

(56) References Cited

OTHER PUBLICATIONS

Ex Parte Quayle Action for U.S. Appl. No. 15/347,452, mailed Jun. 15, 2017, 7 pages.
Final Office Action for U.S. Appl. No. 15/275,957, dated Jan. 2, 2018, 7 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
Ló, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Non-Final Office Action for U.S. Appl. No. 15/883,933, dated Oct. 25, 2019, 19 pages.
Final Office Action for U.S. Appl. No. 15/697,658, dated Oct. 22, 2019, 9 pages.
Capilla, Jose et al., "High-Acoustic-Impedance Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., ""Single-to-balanced Filters for Mobile Phones using Coupled Resonator BAW Technology,"" 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/003,417, dated Apr. 3, 2020, 9 pages.
Non-Final Office Action for U.S. Appl. No. 16/290,175, dated Apr. 14, 2020, 29 pages.
Non-Final Office Action for U.S. Appl. No. 16/283,044, dated Nov. 12, 2020, 9 pages.
Notice of Allowance for U.S. Appl. No. 15/697,658, dated Nov. 17, 2020, 7 pages.
Advisory Action for U.S. Appl. No. 15/883,933, dated Dec. 31, 2020, 3 pages.
Non-Final Office Action for U.S. Appl. No. 16/290,175, dated Jan. 6, 2021, 14 pages.
Non-Final Office Action for U.S. Appl. No. 15/883,933, dated Mar. 29, 2021, 11 pages.
Non-Final Office Action for U.S. Appl. No. 16/740,667, dated Mar. 4, 2021, 10 pages.
Non-Final Office Action for U.S. Appl. No. 16/776,738, dated Mar. 4, 2021, 7 pages.
Non-Final Office Action for U.S. Appl. No. 16/806,166, dated Mar. 18, 2021, 6 pages.
Notice of Allowance for U.S. Appl. No. 16/290,175, dated Jun. 14, 2021, 7 pages.
Corrected Notice of Allowability for U.S. Appl. No. 16/290,175, dated Jun. 23, 2021, 4 pages.
Notice of Allowance for U.S. Appl. No. 16/740,667, dated Jun. 11, 2021, 7 pages.
Notice of Allowance for U.S. Appl. No. 16/776,738, dated Jun. 11, 2021, 7 pages.
Notice of Allowance for U.S. Appl. No. 16/806,166, dated Jun. 18, 2021, 7 pages.

* cited by examiner

ZERO-OUTPUT COUPLED RESONATOR FILTER AND RELATED RADIO FREQUENCY FILTER CIRCUIT

RELATED APPLICATIONS

This application is a continuation-in-part of U.S. patent application Ser. No. 15/883,933, filed on Jan. 30, 2018 and published as U.S. Patent Application Publication No. 2018/0219530, which claims the benefit of U.S. provisional patent application Ser. No. 62/451,915, filed on Jan. 30, 2017, the disclosures of which are incorporated herein by reference in their entireties.

FIELD OF THE DISCLOSURE

The technology of the disclosure relates generally to a radio frequency (RF) acoustic filter circuit.

BACKGROUND

Wireless devices have become increasingly common in current society. The prevalence of these wireless devices is driven in part by the many functions that are now enabled on such devices for supporting a variety of wireless communication technologies in a variety of radio frequency (RF) spectrums. In this regard, a wireless device can employ a large number of RF filters to selectively pass and/or reject a selected RF spectrum(s) associated with a selected wireless communication technology.

Acoustic resonators, such as surface acoustic wave (SAW) resonators and bulk acoustic wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW and BAW-based filters also have relatively low insertion loss, tend to decrease in size as the frequency of operation increases, and are relatively stable over wide temperature ranges.

As such, SAW and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include a zero-output coupled resonator filter (ZO-CRF) and related radio frequency (RF) filter circuit. As the name suggests, a ZO-CRF differs from a conventional CRF in that the ZO-CRF does not have an output port. In this regard, in examples discussed herein, the ZO-CRF can be configured to function as a shunt resonator(s) in an RF filter circuit (e.g., a ladder filter circuit). The ZO-CRF includes a first resonator and a second resonator that are coupled to each other via a coupling layer. The first resonator and the second resonator receive a first voltage and a second voltage, respectively. The first voltage and the second voltage can be configured in a number of ways to cause the ZO-CRF to resonate at different resonance frequencies. As such, it may be possible to modify resonance frequency of the ZO-CRF in an RF filter circuit based on signal connection. As a result, it may be possible to reduce total inductance of the RF filter circuit, thus helping to reduce footprint of the RF filter circuit.

In one aspect, a ZO-CRF is provided. The ZO-CRF includes a first resonator comprising a first electrode, a second electrode, and a first piezoelectric plate disposed between the first electrode and the second electrode. The first resonator is configured to receive a first voltage between the first electrode and the second electrode. The ZO-CRF also includes a second resonator comprising a third electrode, a fourth electrode, and a second piezoelectric plate disposed between the third electrode and the fourth electrode. The second resonator is configured to receive a second voltage between the fourth electrode and the third electrode. The ZO-CRF also includes a coupling layer disposed between the second electrode and the third electrode. The first voltage and the second voltage are configured to cause the ZO-CRF to resonate at a selected resonance frequency.

In another aspect, an RF filter circuit is provided. The RF filter circuit includes an input port configured to receive an RF signal. The RF filter circuit also includes an output port configured to output the RF signal. The RF filter circuit also includes a series resonator coupled between the input port and the output port and configured to resonate at a defined resonance frequency to pass the RF signal from the input port to the output port. The RF filter circuit also includes a ZO-CRF coupled between the series resonator and a ground. The ZO-CRF includes a first resonator comprising a first electrode, a second electrode, and a first piezoelectric plate disposed between the first electrode and the second electrode. The first resonator is configured to receive a first voltage between the first electrode and the second electrode. The ZO-CRF also includes a second resonator comprising a third electrode, a fourth electrode, and a second piezoelectric plate disposed between the third electrode and the fourth electrode. The second resonator is configured to receive a second voltage between the fourth electrode and the third electrode. The ZO-CRF also includes a coupling layer disposed between the second electrode and the third electrode. The first voltage and the second voltage are configured to cause the ZO-CRF to resonate at a selected resonance frequency to shunt the RF signal to the ground.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
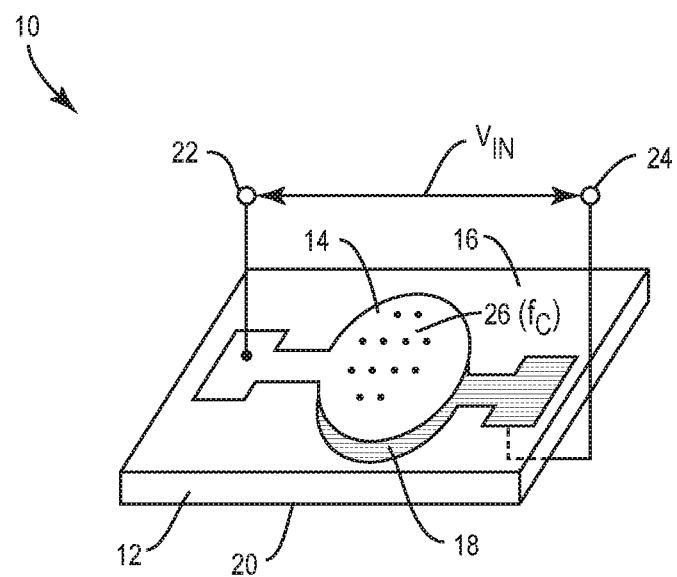
FIG. 1 is a schematic diagram of an exemplary bulk acoustic wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a zero-output coupled resonator filter (ZO-CRF) and related radio frequency (RF) filter circuit. As the name suggests, a ZO-CRF differs from a conventional CRF in that the ZO-CRF does not have an output port. In this regard, in examples discussed herein, the ZO-CRF can be configured to function as a shunt resonator(s) in an RF filter circuit (e.g., a ladder filter circuit). The ZO-CRF includes a first resonator and a second resonator that are coupled to each other via a coupling layer. The first resonator and the second resonator receive a first voltage and a second voltage, respectively. The first voltage and the second voltage can be configured in a number of ways to cause the ZO-CRF to resonate at different resonance frequencies. As such, it may be possible to modify resonance frequency of the ZO-CRF in an RF filter circuit based on signal connection. As a result, it may be possible to reduce total inductance of the RF filter circuit, thus helping to reduce footprint of the RF filter circuit.

Before discussing a ZO-CRF and a related RF filter circuit incorporating the ZO-CRF of the present disclosure, a brief discussion of a bulk acoustic wave (BAW) resonator is first provided with reference to FIG. 1. An overview of a conventional CRF and an electrical equivalent circuit of the conventional CRF is then provided with reference to FIGS. 2A-2D to help establish a CRF equivalent electrical model.

The discussion of specific exemplary aspects of the ZO-CRF and related RF filter circuit of the present disclosure starts below with reference to FIG. 3.

In this regard, FIG. 1 is a schematic diagram of an exemplary BAW resonator 10. The BAW resonator 10 includes a piezoelectric layer 12 (e.g., a quartz crystal), a top metal electrode 14 disposed on a top surface 16 of the piezoelectric layer 12, and a bottom metal electrode 18 disposed on a bottom surface 20 of the piezoelectric layer 12. The top metal electrode 14 and the bottom metal electrode 18 are coupled to an input port 22 and an output port 24, respectively.

When a voltage $V_{IN}$ is applied between the input port 22 and the output port 24, an acoustic wave 26 is excited and resonates at a resonance frequency $f_C$ between the top surface 16 and the bottom surface 20 of the piezoelectric layer 12. The resonance frequency $f_C$ may be determined by a thickness of the piezoelectric layer 12 as well as a mass of the top metal electrode 14 and the bottom metal electrode 18.

The BAW resonator 10 may be configured to expand the piezoelectric layer 12 when a positive voltage $V_{IN}$ is applied between the input port 22 and the output port 24 and compress the piezoelectric layer 12 when a negative voltage $V_{IN}$ is applied between the input port 22 and the output port 24. As such, the BAW resonator 10 in which the piezoelectric layer 12 expands and compresses respectively in response to the positive voltage $V_{IN}$ and the negative voltage $V_{IN}$ is also known as a polarized BAW resonator.

Alternatively, the BAW resonator 10 may be configured to compress the piezoelectric layer 12 when the positive voltage $V_{IN}$ is applied between the input port 22 and the output port 24 and expand the piezoelectric layer 12 when the negative voltage $V_{IN}$ is applied between input port 22 and the output port 24. As such, the BAW resonator 10 in which the piezoelectric layer 12 compresses and expands respectively in response to the positive voltage $V_{IN}$ and the negative voltage $V_{IN}$ is also known as a polarized inverted BAW resonator.

Figure 2A:
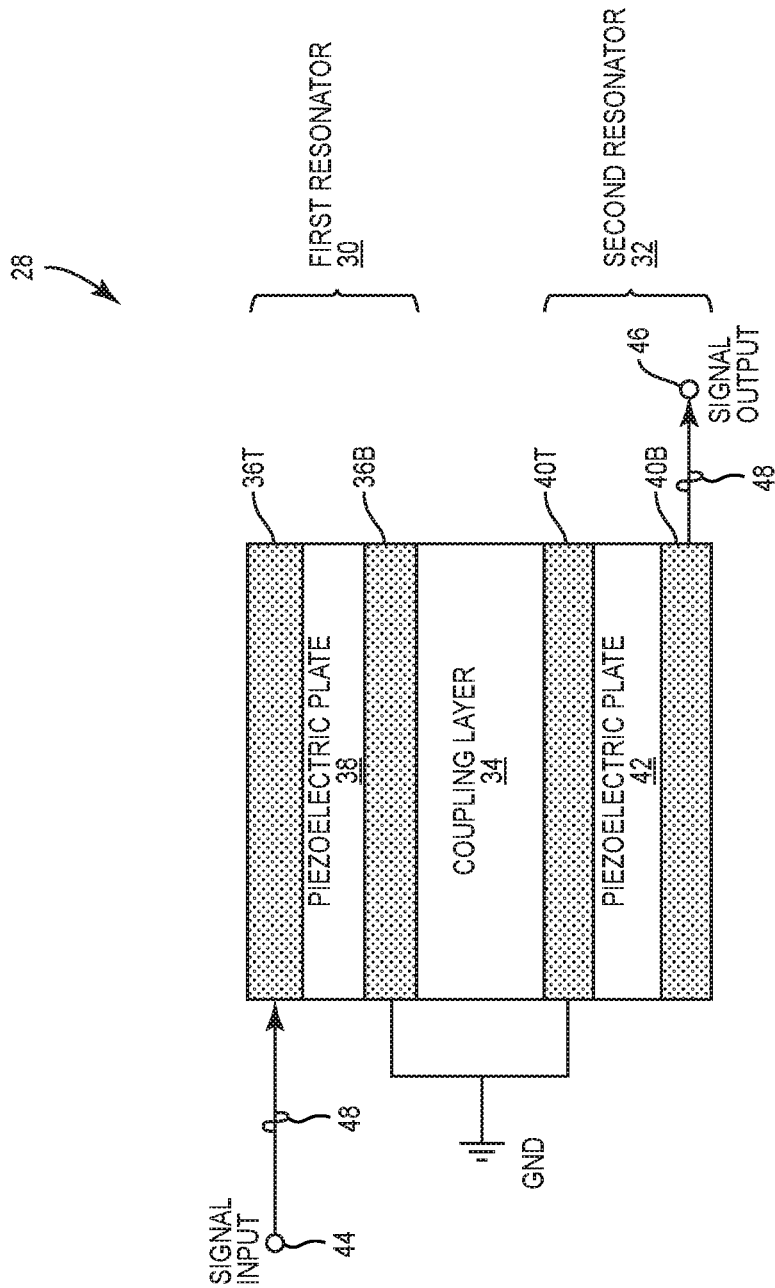
FIG. 2A is a schematic diagram of an exemplary conventional coupled resonator filter (CRF) formed by coupling a first resonator with a second resonator via a coupling layer.

FIG. 2A is a schematic diagram of an exemplary conventional CRF 28 formed by coupling a first resonator 30 with a second resonator 32 via a coupling layer 34. In a non-limiting example, each of the first resonator 30 and the second resonator 32 can be functionally equivalent to the BAW resonator 10 of FIG. 1.

The first resonator 30 includes a first top electrode 36T, a first bottom electrode 36B, and a first piezoelectric plate 38 provided in between the first top electrode 36T and the first bottom electrode 36B. The second resonator 32 includes a second top electrode 40T, a second bottom electrode 40B, and a second piezoelectric plate 42 provided in between the second top electrode 40T and the second bottom electrode 40B. The coupling layer 34 is provided between the first bottom electrode 36B and the second top electrode 40T. Both the first bottom electrode 36B and the second top electrode 40T are coupled to a ground (GND).

The first top electrode 36T is coupled to an input port 44 and the second bottom electrode 40B is coupled to an output port 46. The conventional CRF 28 may be configured to pass an RF signal 48 within a defined resonance frequency bandwidth, while rejecting an unwanted signal(s) outside the defined resonance frequency bandwidth (not shown). In this regard, the conventional CRF 28 can be referred to as a single-input, single-output (SISO) CRF.

Figures 2B, 2C:
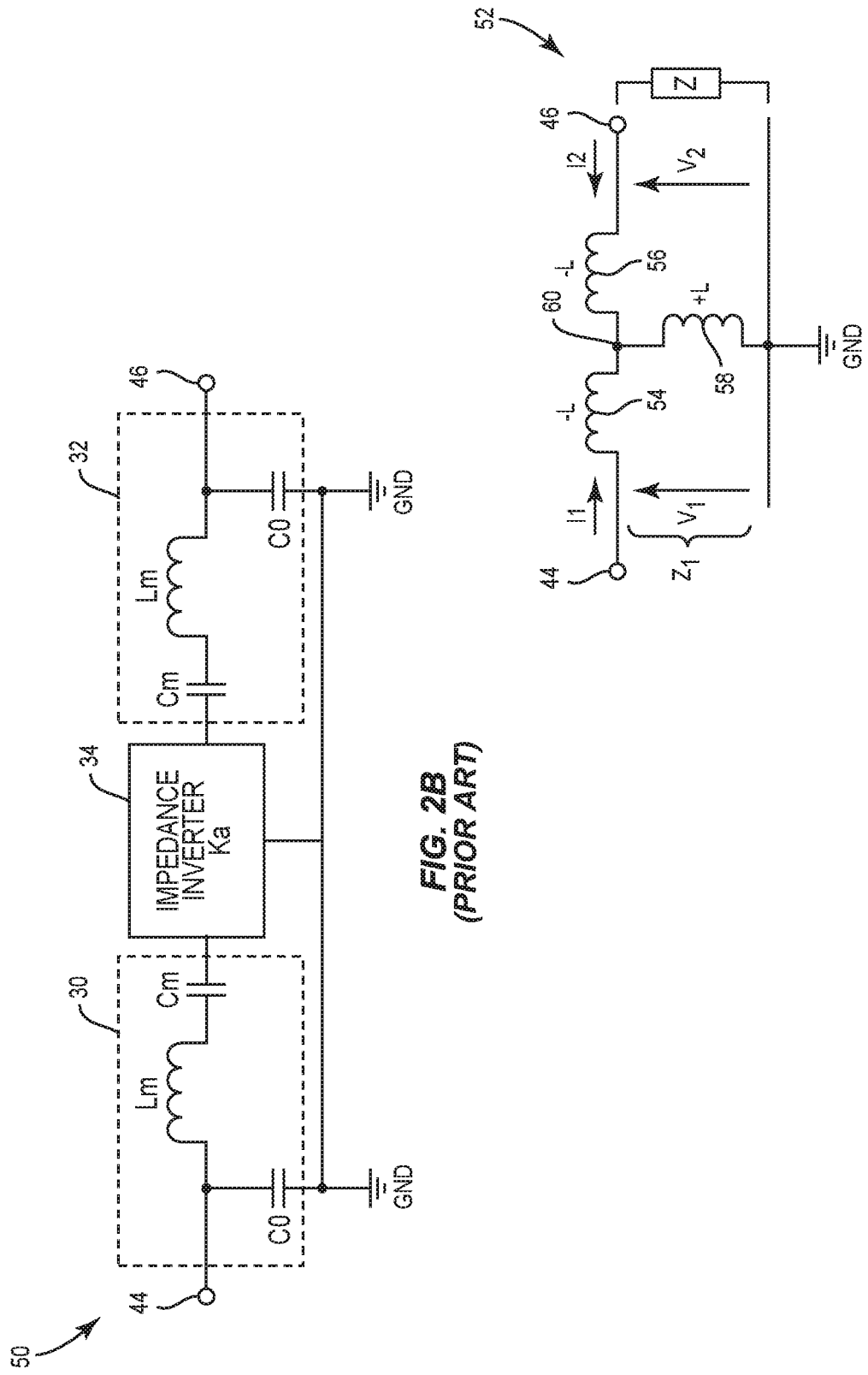
FIG. 2B is schematic diagram of an exemplary CRF equivalent circuit configured to provide an equivalent electrical model of the conventional CRF in FIG. 2A.
FIG. 2C is a schematic diagram of an equivalent inductor network configured to model an impedance inverter in the CRF equivalent circuit of FIG. 2B.

The conventional CRF 28 may be modeled by a CRF equivalent electrical model. In this regard, FIG. 2B is schematic diagram of an exemplary CRF equivalent circuit 50 configured to provide an equivalent electrical model of the conventional CRF 28 in FIG. 2A. Common elements between FIGS. 2A and 2B are shown therein with common element numbers and will not be re-described herein.

In the CRF equivalent circuit 50, each of the first resonator 30 and the second resonator 32 is an inductor-capacitor (LC) circuit that includes an inductor Lm, a capacitor Cm coupled in series with the inductor Lm, and a second capacitor C0 coupled to the GND. In addition, the coupling layer 34 is modeled by an impedance inverter Ka.

FIG. 2C is a schematic diagram of an equivalent inductor network 52 configured to model the impedance inverter Ka in the CRF equivalent circuit 50 of FIG. 2B. Common elements between FIGS. 2B and 2C are shown therein with common element numbers and will not be re-described herein.

In a non-limiting example, the equivalent inductor network 52 includes a first inductor 54 and a second inductor 56 coupled in series between the input port 44 and the output port 46. The equivalent inductor network 52 also includes a third inductor 58 coupled in between a coupling node 60 and the GND.

When a load impedance Z is connected between the output port 46 and the GND, a source impedance $Z_1$ as seen between the input port 44 and the GND would be equal to $Ka^2/Z$. Accordingly, a relationship between a first voltage $V_1$, a first current $I_1$, a second voltage $V_2$, and a second current $I_2$ can be expressed in equation (Eq. 1) below.

$$\begin{bmatrix} V_1 \\ I_1 \end{bmatrix} = \begin{bmatrix} 0 & -jwL \\ -j/wL & 0 \end{bmatrix} \begin{bmatrix} V_2 \\ -I_2 \end{bmatrix} \quad \text{(Eq. 1)}$$

In the equation (Eq. 1) above, w represents a pulsation of the coupling layer 34 and L represents a respective inductance of the first inductor 54, the second inductor 56, and the third inductor 58. Accordingly, the impedance inverter Ka can be determined based on equation (Eq. 2) below.

$$V_1 = +j*w*L*I_2$$

$$V_2 = +j*w*L*I_1 = -Z*I_2$$

$$V_1/I_1 = Z_{inv} = +(L*w)/Z$$

$$Ka = L*w \quad \text{(Eq. 2)}$$

Figure 2D:
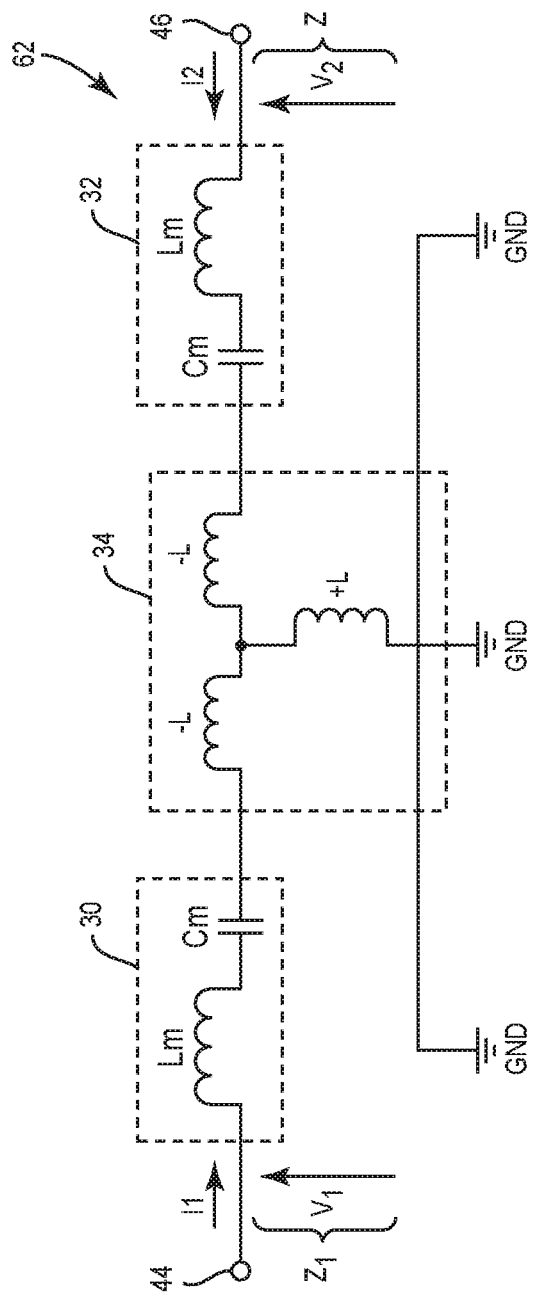
FIG. 2D is a schematic diagram of an exemplary CRF equivalent electrical circuit formed by incorporating the equivalent inductor network of FIG. 2C with the CRF equivalent circuit of FIG. 2B.

The equivalent inductor network 52 can be used to model the impedance inverter Ka in the CRF equivalent circuit 50 of FIG. 2B. In this regard, FIG. 2D is a schematic diagram of an exemplary CRF equivalent electrical circuit 62 formed by incorporating the equivalent inductor network 52 of FIG. 2C with the CRF equivalent circuit 50 of FIG. 2B. Common elements between FIGS. 2B, 2C, and 2D are shown therein with common element numbers and will not be re-described herein.

It may be assumed that the second capacitor C0 in the CRF equivalent circuit 50 is small or can be considered as part of the source impedance $Z_1$ and/or the load impedance Z. As such, it may be possible to eliminate the second capacitor C0 from the CRF equivalent electrical circuit 62 to help simplify the analysis.

A number of equations can be developed based on the CRF equivalent electrical circuit 62 in conjunction with equations (Eq. 1 and Eq. 2).

$$V_1 = j*(Lm-L)*w*I_1 - j/(Cm*w)*I_1 + j*L*w*(I_1+I_2)$$

$$V_3 = j*(Lm-L)*w*I_3 - j/(Cm*w)*I_2 + j*L*w*(I_1+I_2)$$

$$V_2 = [j*Lm*w - j/(Cm*w)]*I_2 + j*L*w*I_1$$

$$I_2 = (V_2 - j*L*w*I_1)/(j*Lm*w - j/(Cm*w))$$

$$V_1 = (j*Lm*w - j/(Cm*w))*I_1 + j*L*w/(j*Lm*w - j/(Cm*w))*(V_2 - j*L*w*I_1)$$

$$V_1 = I_1*[j*Lm*w - j/(Cm*w) + L^2*w^2/(j*Lm*w - j/(Cm*w))] + V_2*j*L*w/(j*Lm*w - j/(Cm*w))$$

$$I_1 = [V_1 - V_2*j*L*w/(j*Lm*w - j/(Cm*w))]/[j*Lm*w - j/(Cm*w) + L^2*w^2/(j*Lm*w - j/(Cm*w))]$$

$$I_1 = (j*Lm*w - j/(Cm*w))*[V_1 - V_2*j*L*w/(j*Lm*w - j/(Cm*w))]/[L^2*w^2 - (Lm*w - 1/(Cm*w))^2]$$

Accordingly, the first current I1 and the second current I2 can be expressed in equation (Eq. 3.1) and equation (Eq. 3.2), respectively.

$$I_1 = j*[(Lm*w - 1/(Cm*w))*V_1 - L*w*V_2]/[L^2*w^2 - (Lm*w - 1/(Cm*w))^2] \quad \text{(Eq. 3.1)}$$

$$I_2 = j*[(Lm*w - 1/(Cm*w))*V_2 - L*w*V_1]/[L^2*w^2 - (Lm*w - 1/(Cm*w))^2] \quad \text{(Eq. 3.2)}$$

By assuming that $V_2 = (1-\alpha)*V_1$, wherein $\alpha$ represents a tuning factor, and replacing $V_2$ accordingly in the equation (Eq. 3.1), the following equations can be created.

$$I_1 = j*[Lm*w - 1/(Cm*w) - (1-\alpha)*L*w]/[L^2*w^2 - (Lm*w - 1/(Cm*w))^2]*V_1$$

$$I_1 = j*[Lm*w - 1/(Cm*w) - L*w]/[L^2*w^2 - (Lm*w - 1/(Cm*w))^2]*V_1 + j*\alpha*L*w/[L^2*w^2 - (Lm*w - 1/(Cm*w))^2]*V_1$$

$$I_1 = -j*V_1/[(Lm+L)*w - 1/(Cm*w)] + j*\alpha*L*w/[L^2*w^2 - (Lm*w - 1/(Cm*w))^2]*V_1$$

$$I_1 = -j*V_1/[(Lm+L)*w - 1/(Cm*w)] + j*\alpha*L*w/[(L*w - Lm*w + 1/(Cm*w))*(L*w + Lm*w - 1/(Cm*w))]*V_1$$

$$I_1 = -j*V_1/[(Lm+L)*w - 1/(Cm*w)] - j*\alpha*L*w*V_1/[((Lm+L)*w - 1/(Cm*w))*((Lm-L)*w - 1/(Cm*w))]$$

$$I_1 = -j*V_1/[(Lm+L)*w - 1/(Cm*w)]*[1 + \alpha*L*w/((Lm-L)*w - 1/(Cm*w))]$$

Accordingly, the source impedance $Z_1$, which equals $V_1/I_1$, can be expressed in equations (Eq. 4.1 and Eq. 4.2) on the next page.

$$Z_1 = j*[(Lm+L)*w - 1/(Cm*w)]/[1 + \alpha*L*w/((Lm-L)*w - 1/(Cm*w))] \quad \text{(Eq. 4.1)}$$

$$Z_1 = j*[(Lm+L)*w - 1/(Cm*w)]*[(Lm-L)*w - 1/(Cm*w)]/[(Lm-(1-\alpha)*L)*w - 1/(Cm*w)] \quad \text{(Eq. 4.2)}$$

Similarly, the load impedance Z, which equals $V_2/I_2$, can be expressed in equations (Eq. 4.3 and Eq. 4.4) below.

$$Z = j*[(Lm+L)*w - 1/(Cm*w)]*(1-\alpha)/[1 - \alpha*(Lm*w - 1/(Cm*w))/((Lm-L)*w - 1/(Cm*w))] \quad \text{(Eq. 4.3)}$$

$$Z = j*[(Lm+L)*w - 1/(Cm*w)]*[(Lm-L)*w - 1/(Cm*w)]/[(Lm-L/(1-\alpha))*w - 1/(Cm*w)] \quad \text{(Eq. 4.4)}$$

Some observations can be made from the equations above. First, the source impedance $Z_1$ and/or the load impedance Z can be configured to resonate at a selected resonance frequency based on the first voltage $V_1$ and the second voltage $V_2$. Second, the second voltage $V_2$ can be related to the first voltage $V_1$ by the tuning factor $\alpha$. As discussed in detail below, it may be possible to configure a CRF to resonate at a selected resonance frequency by controlling the first voltage $V_1$ and the second voltage $V_2$.

Figure 3:
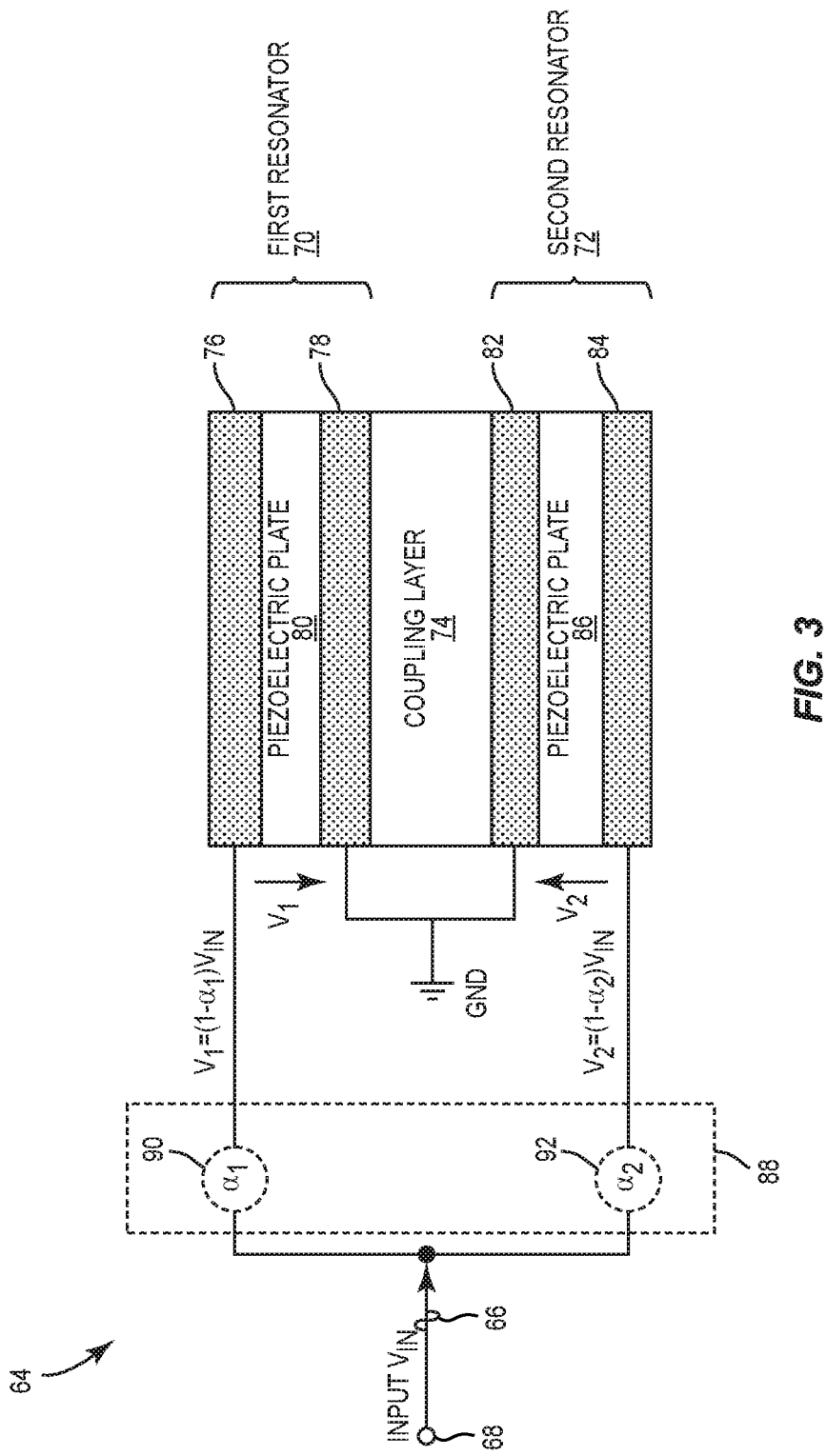
FIG. 3 is a schematic diagram of an exemplary zero-output CRF (ZO-CRF) configured according to an embodiment of the present disclosure to resonate at a selected resonance frequency.

In this regard, FIG. 3 is a schematic diagram of an exemplary ZO-CRF 64 configured according to an embodiment of the present disclosure to resonate at a selected resonance frequency. The ZO-CRF 64 differs from the conventional CRF 28 of FIG. 2A in that the ZO-CRF 64 does not include the output port 46 as in the conventional CRF 28. In this regard, in examples discussed herein, the ZO-CRF 64 is configured to function primarily as a shunt resonator to shunt an RF signal 66 from an input port 68 to a ground (GND).

The ZO-CRF 64 includes a first resonator 70 and a second resonator 72 that are coupled to each other by a coupling layer 74. The first resonator 70 includes a first electrode 76, a second electrode 78, and a first piezoelectric plate 80 sandwiched between the first electrode 76 and the second electrode 78. The second resonator 72 includes a third electrode 82, a fourth electrode 84, and a second piezoelectric plate 86 sandwiched between the third electrode 82 and the fourth electrode 84. The coupling layer 74 is provided between the second electrode 78 and the third electrode 82. In one non-limiting example, the first resonator 70 and the second resonator 72 can be configured to resonate in an identical resonance frequency. In this regard, the first piezoelectric plate 80 and the second piezoelectric plate 86 may have identical thickness. In another non-limiting example, the first resonator 70 and the second resonator 72 can be configured to resonate in different resonance frequencies. In this regard, the first piezoelectric plate 80 and the second piezoelectric plate 86 may have different thicknesses.

In a non-limiting example, the first electrode 76 and the fourth electrode 84 are coupled to the input port 68, which is configured to receive an input voltage $V_{IN}$. In the same non-limiting example, the second electrode 78 and the third electrode 82 are coupled to the GND. Accordingly, the first resonator 70 is configured to receive a first voltage $V_1$ between the first electrode 76 and the second electrode 78, and the second resonator 72 is configured to receive a second voltage $V_2$ between the fourth electrode 84 and the third electrode 82.

A tuning element 88 may be used to generate the first voltage $V_1$ and the second voltage $V_2$ based on the input voltage $V_{IN}$. In a non-limiting example, the tuning element 88 can include a first tuner 90 corresponding to a first tuning factor $\alpha_1$ and a second tuner 92 corresponding to a second tuning factor $\alpha_2$. Notably, the first tuning factor $\alpha_1$ and the second tuning factor $\alpha_2$ can be any finite number. In examples discussed herein, each of the first tuning factor $\alpha_1$ and the second tuning factor $\alpha_2$ can be any of the integers 0, 1, or 2. Accordingly, the first voltage $V_1$ and the second voltage $V_2$ are equal to $(1-\alpha_1)*V_{IN}$ and $(1-\alpha_2)*V_{IN}$, respectively. In this regard, the second voltage $V_2$ can be determined based on the first voltage V1 as follows.

$$V_2 = (1-\alpha)*V_1, \text{ wherein } \alpha = (\alpha_2 - \alpha_1)/(1 - \alpha_1)$$

As discussed in FIGS. 4A-4E below, the first voltage $V_1$ and the second voltage $V_2$ can be configured in a number of ways to cause the ZO-CRF 64 to resonate at a selected resonance frequency. Common elements between FIGS. 3 and 4A-4E are shown therein with common element numbers and will not be re-described herein.

Figure 4A:
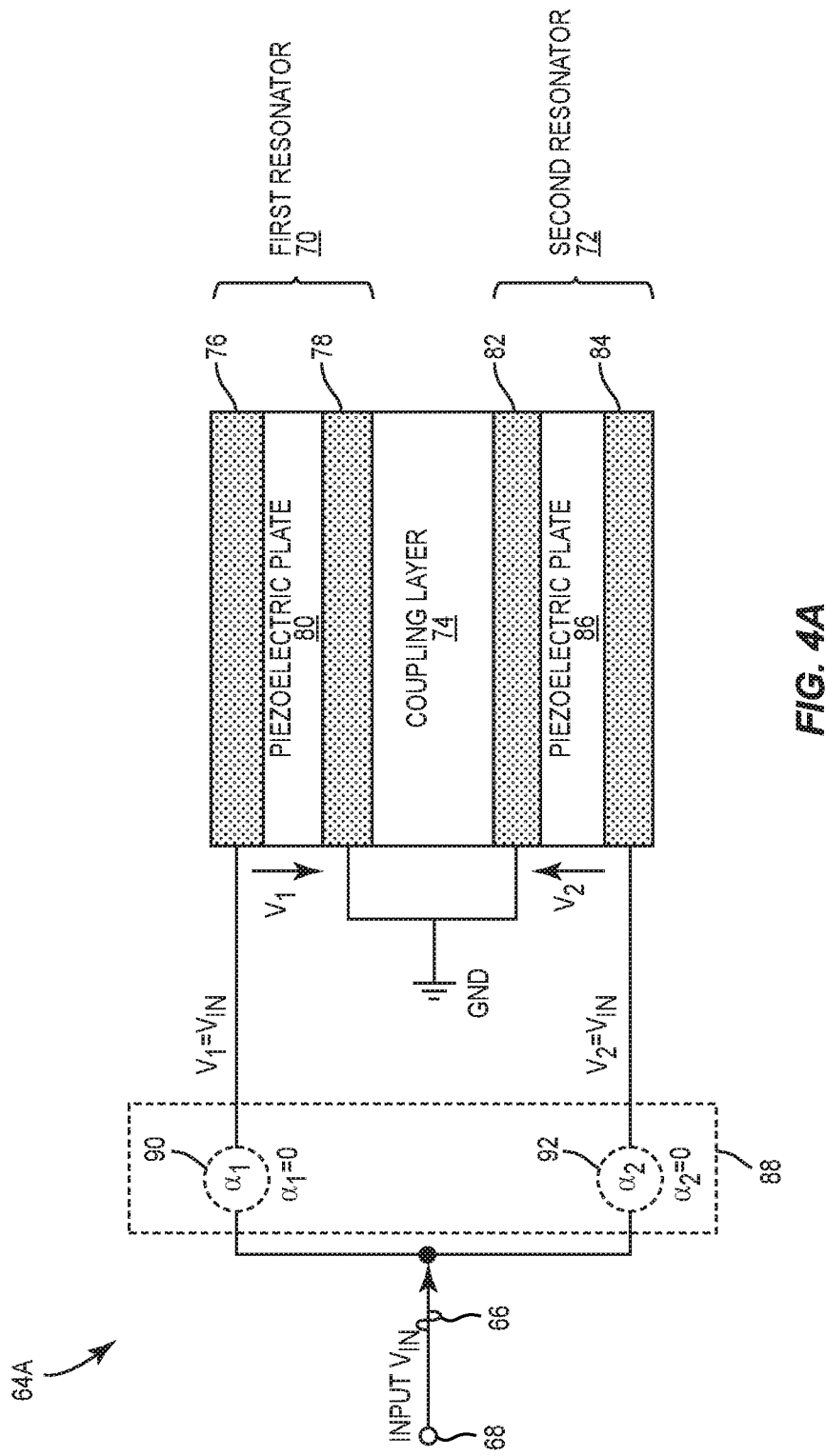
FIG. 4A is a schematic diagram of an exemplary ZO-CRF configured according to one embodiment of the present disclosure.

FIG. 4A is a schematic diagram of an exemplary ZO-CRF 64A configured according to one embodiment of the present disclosure. In the ZO-CRF 64A, the first tuning factor $\alpha_1$ and the second tuning factor $\alpha_2$ are configured to both equal zero (0) ($\alpha_1=\alpha_2=0$). In this regard, the first voltage $V_1$ and the second voltage $V_2$ both equal the input voltage $V_{IN}$ ($V_1=V_2=V_{IN}$). The source impedance $Z_1$ and the load impedance Z can be determined based on equations (Eq. 5.1 and Eq. 5.2) below.

$$Z_1 = j*[(Lm+L)*w - 1/(Cm*w)] \qquad (Eq.\ 5.1)$$

$$Z = j*[(Lm+L)*w - 1/(Cm*w)] \qquad (Eq.\ 5.2)$$

Accordingly, the source impedance $Z_1$ and the load impedance Z each has a single series resonance frequency at $1/((Lm+L)*Cm)$.

Figure 4B:
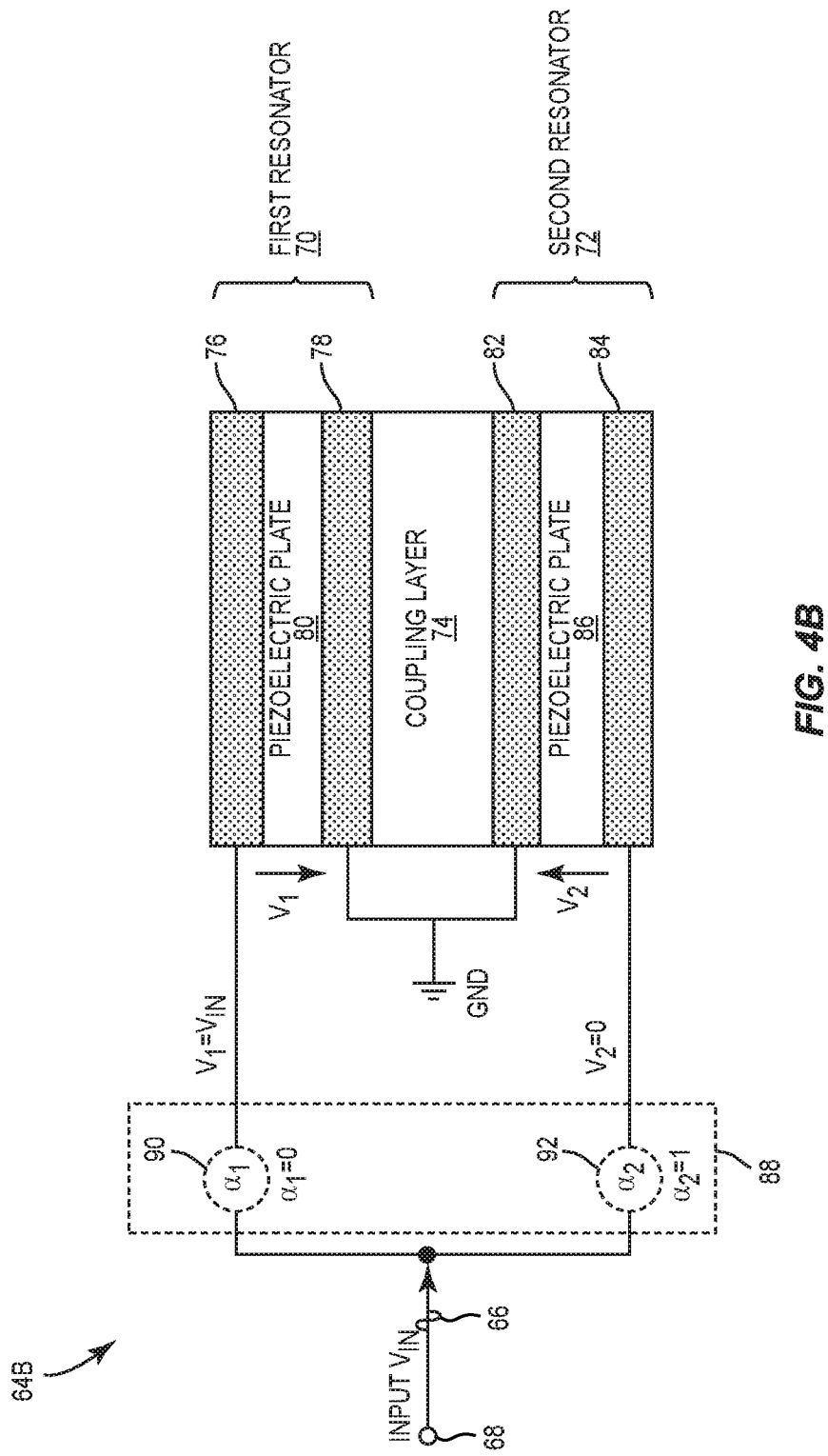
FIG. 4B is a schematic diagram of an exemplary ZO-CRF configured according to another embodiment of the present disclosure.

FIG. 4B is a schematic diagram of an exemplary ZO-CRF 64B configured according to another embodiment of the present disclosure. In the ZO-CRF 64B, the first tuning factor $\alpha_1$ and the second tuning factor $\alpha_2$ are configured to both equal 0 and one (1), respectively ($\alpha_1=0$, $\alpha_2=1$). In this regard, the first voltage $V_1$ equals the input voltage $V_{IN}$ and the second voltage $V_2$ equals 0 ($V_1=V_{IN}$, $V_2=0$). The source impedance $Z_1$ can be determined based on equation (Eq. 6) below.

$$Z_1 = j*[(Lm+L)*w - 1/(Cm*w)]*[(Lm-L)*w - 1/(Cm*w)] / [Lm*w - 1/(Cm*w)] \qquad (Eq.\ 6)$$

Accordingly, the source impedance $Z_1$ has a lower series resonance frequency at $1/((Lm+L)*Cm)$ and an upper series resonance frequency at $1/((Lm-L)*Cm)$. In addition, the source impedance $Z_1$ also has a parallel resonance frequency at $1/(Lm*Cm)$.

Figure 4C:
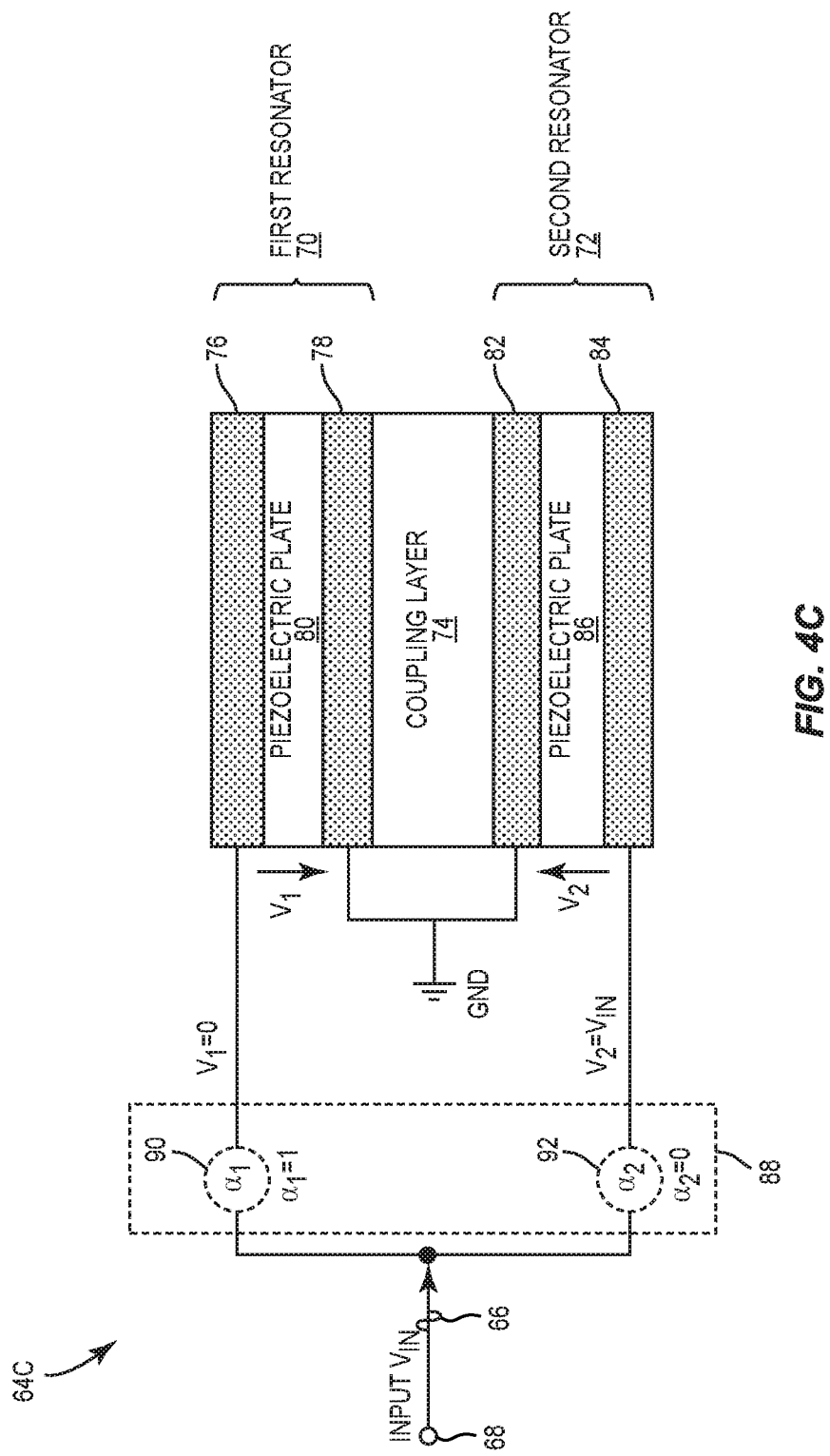
FIG. 4C is a schematic diagram of an exemplary ZO-CRF configured according to another embodiment of the present disclosure.

FIG. 4C is a schematic diagram of an exemplary ZO-CRF 64C configured according to another embodiment of the present disclosure. In the ZO-CRF 64C, the first tuning factor $\alpha_1$ and the second tuning factor $\alpha_2$ are configured to both equal 1 and 0, respectively ($\alpha_1=1$, $\alpha_2=0$). In this regard, the first voltage $V_1$ equals 0 and the second voltage $V_2$ equals the input voltage $V_{IN}$ ($V_1=0$, $V_2=V_{IN}$). The load impedance Z can be determined based on equation (Eq. 7) below.

$$Z = j*[(Lm+L)*w - 1/(Cm*w)]*[(Lm-L)*w - 1/(Cm*w)] / [Lm*w - 1/(Cm*w)] \qquad (Eq.\ 7)$$

Accordingly, the load impedance Z has a lower series resonance frequency at $1/((Lm+L)*Cm)$ and an upper series resonance frequency at $1/((Lm-L)*Cm)$. In addition, the load impedance Z also has a parallel resonance frequency at $1/(Lm*Cm)$.

Figure 4D:
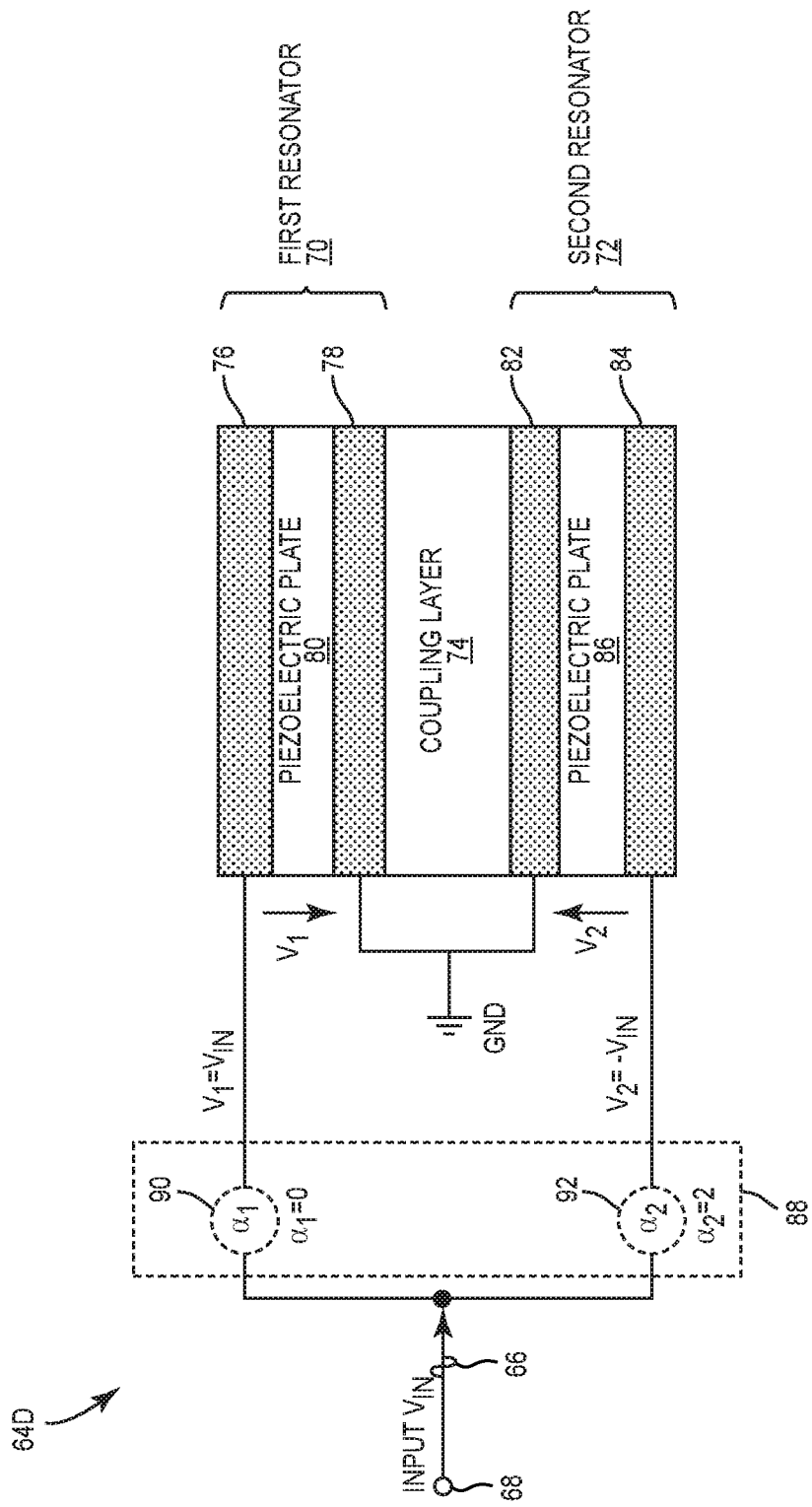
FIG. 4D is a schematic diagram of an exemplary ZO-CRF configured according to another embodiment of the present disclosure.

FIG. 4D is a schematic diagram of an exemplary ZO-CRF 64D configured according to another embodiment of the present disclosure. In the ZO-CRF 64D, the first tuning factor $\alpha_1$ and the second tuning factor $\alpha_2$ are configured to both equal 0 and 2, respectively ($\alpha_1=0$, $\alpha_2=2$). In this regard, the first voltage $V_1$ equals the input voltage $V_{IN}$ and the second voltage $V_2$ equals an inverse of the input voltage $V_{IN}$ ($V_1=V_{IN}$, $V_2=-V_{IN}$). The source impedance $Z_1$ and the load impedance Z can be determined based on equations (Eq. 8.1 and Eq. 8.2) below.

$$Z_1 = j*[(Lm-L)*w - 1/(Cm*w)] \qquad (Eq.\ 8.1)$$

$$Z = j*[(Lm-L)*w - 1/(Cm*w)] \qquad (Eq.\ 8.2)$$

Accordingly, the source impedance $Z_1$ and the load impedance Z each has a single series resonance frequency at $1/((Lm-L)*Cm)$.

Figure 4E:
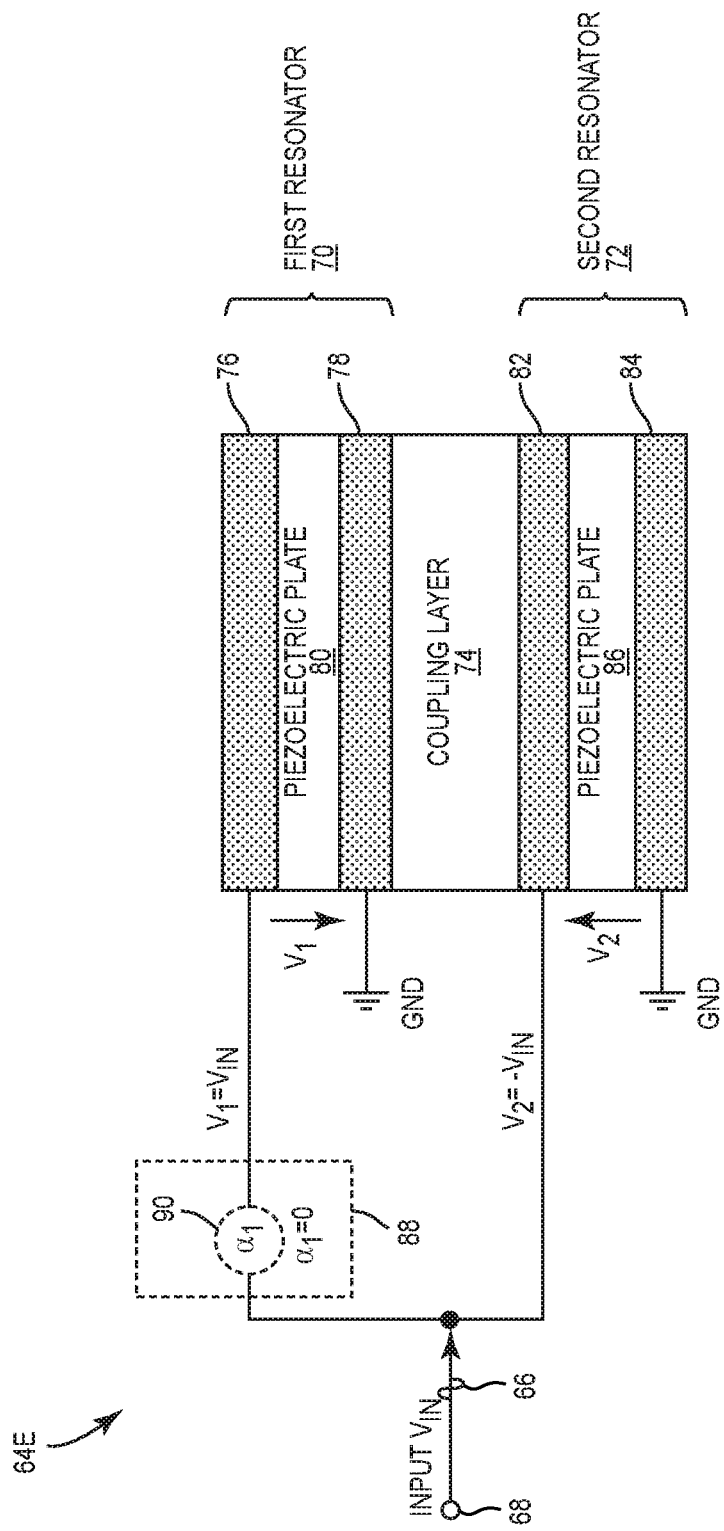
FIG. 4E is a schematic diagram of an exemplary ZO-CRF configured according to another embodiment of the present disclosure.

FIG. 4E is a schematic diagram of an exemplary ZO-CRF 64E configured according to another embodiment of the present disclosure. In the ZO-CRF 64E, the first electrode 76 and the third electrode 82 are coupled to the input port 68, and the second electrode 78 and the fourth electrode 84 are coupled to the GND. The first tuning factor $\alpha_1$ is configured to equal 0 ($\alpha_1=0$). In this regard, the first voltage $V_1$ equals the input voltage $V_{IN}$ and the second voltage $V_2$ equals an inverse of the input voltage $V_{IN}$ ($V_1=V_{IN}$, $V_2=-V_{IN}$). The source impedance $Z_1$ can be determined based on equation (Eq. 9) below.

$$Z_1 = Z_1 = j*[(Lm-L)*w - 1/(Cm*w)] \qquad (Eq.\ 9)$$

Accordingly, the source impedance $Z_1$ has a single series resonance frequency at $1/((Lm-L)*Cm)$.

Figure 5:
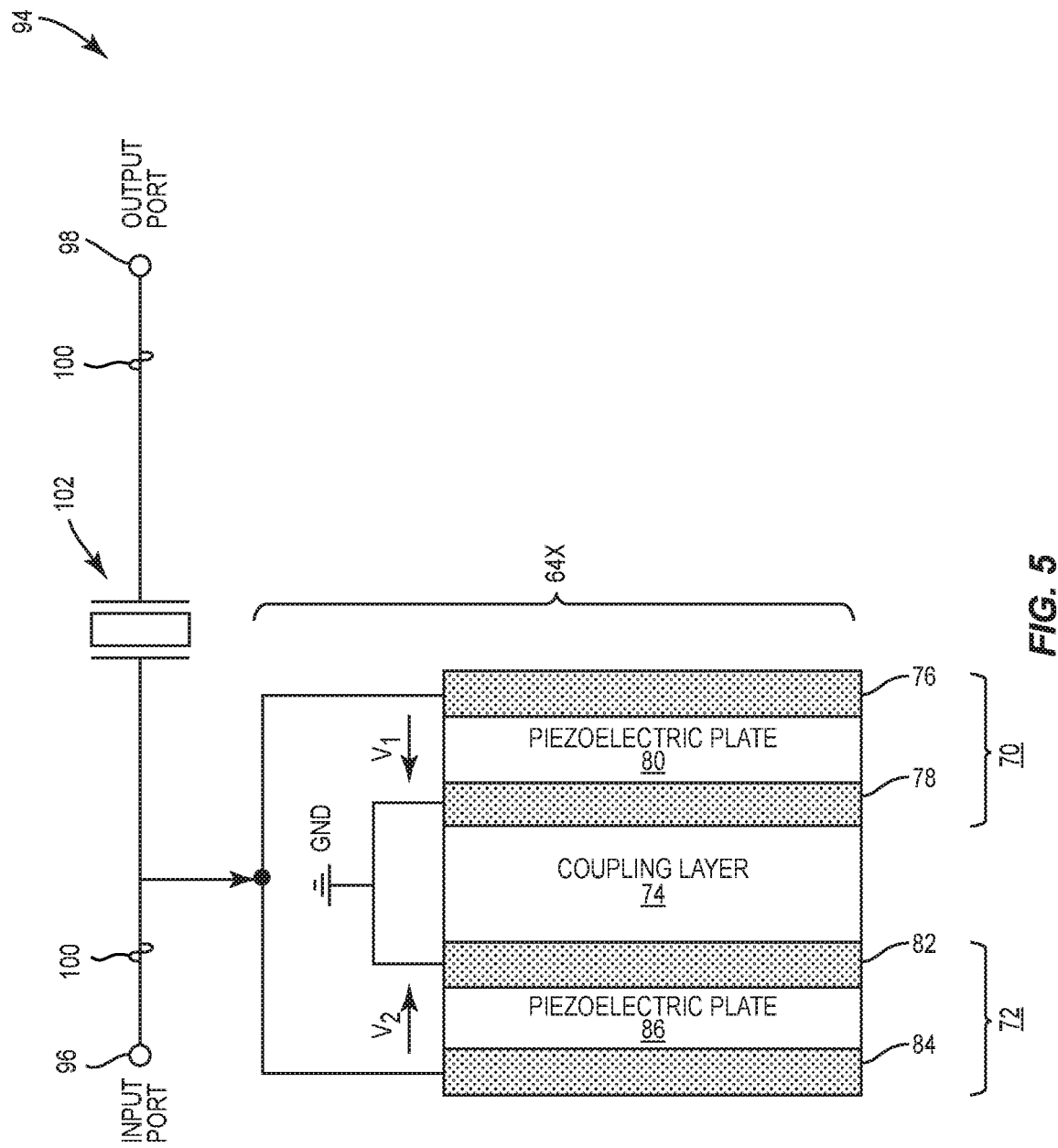
FIG. 5 is a schematic diagram of an exemplary radio frequency (RF) filter circuit configured according to an embodiment of the present disclosure to include any of the ZO-CRFs in FIGS. 3 and 4A-4E.

The ZO-CRF 64 of FIG. 3, the ZO-CRF 64A of FIG. 4A, the ZO-CRF 64B of FIG. 4B, the ZO-CRF 64C of FIG. 4C, the ZO-CRF 64D of FIG. 4D, and the ZO-CRF 64E of FIG. 4E can be provided in an RF filter circuit to function as a shunt resonator. In this regard, FIG. 5 is a schematic diagram of an exemplary RF filter circuit 94 configured according to an embodiment of the present disclosure to include any of the ZO-CRF 64 of FIG. 3, the ZO-CRF 64A of FIG. 4A, the ZO-CRF 64B of FIG. 4B, the ZO-CRF 64C of FIG. 4C, the ZO-CRF 64D of FIG. 4D, and the ZO-CRF 64E of FIG. 4E. Common elements between FIGS. 3, 4A-4E, and 5 are shown therein with common element numbers and will not be re-described herein.

The RF filter circuit 94 includes an input port 96 and an output port 98 configured to receive and output an RF signal 100, respectively. The RF filter circuit 94 includes a series resonator 102 coupled between the input port 96 and the output port 98. The series resonator 102 is configured to resonate at a defined resonance frequency to pass the RF signal 100 from the input port 96 to the output port 98.

The RF filter circuit 94 includes a ZO-CRF 64X, which can be any of the ZO-CRF 64 of FIG. 3, the ZO-CRF 64A of FIG. 4A, the ZO-CRF 64B of FIG. 4B, the ZO-CRF 64C of FIG. 4C, the ZO-CRF 64D of FIG. 4D, and the ZO-CRF 64E of FIG. 4E. The ZO-CRF 64X is coupled between the series resonator 102 and the GND. In this regard, the ZO-CRF 64X is configured to function as a shunt resonator in the RF filter circuit 94. Accordingly, the first voltage $V_1$ and the second voltage $V_2$ are configured to cause the ZO-CRF 64X to resonate at the selected resonance frequency to shunt the RF signal 100 to the GND.

Figure 6:
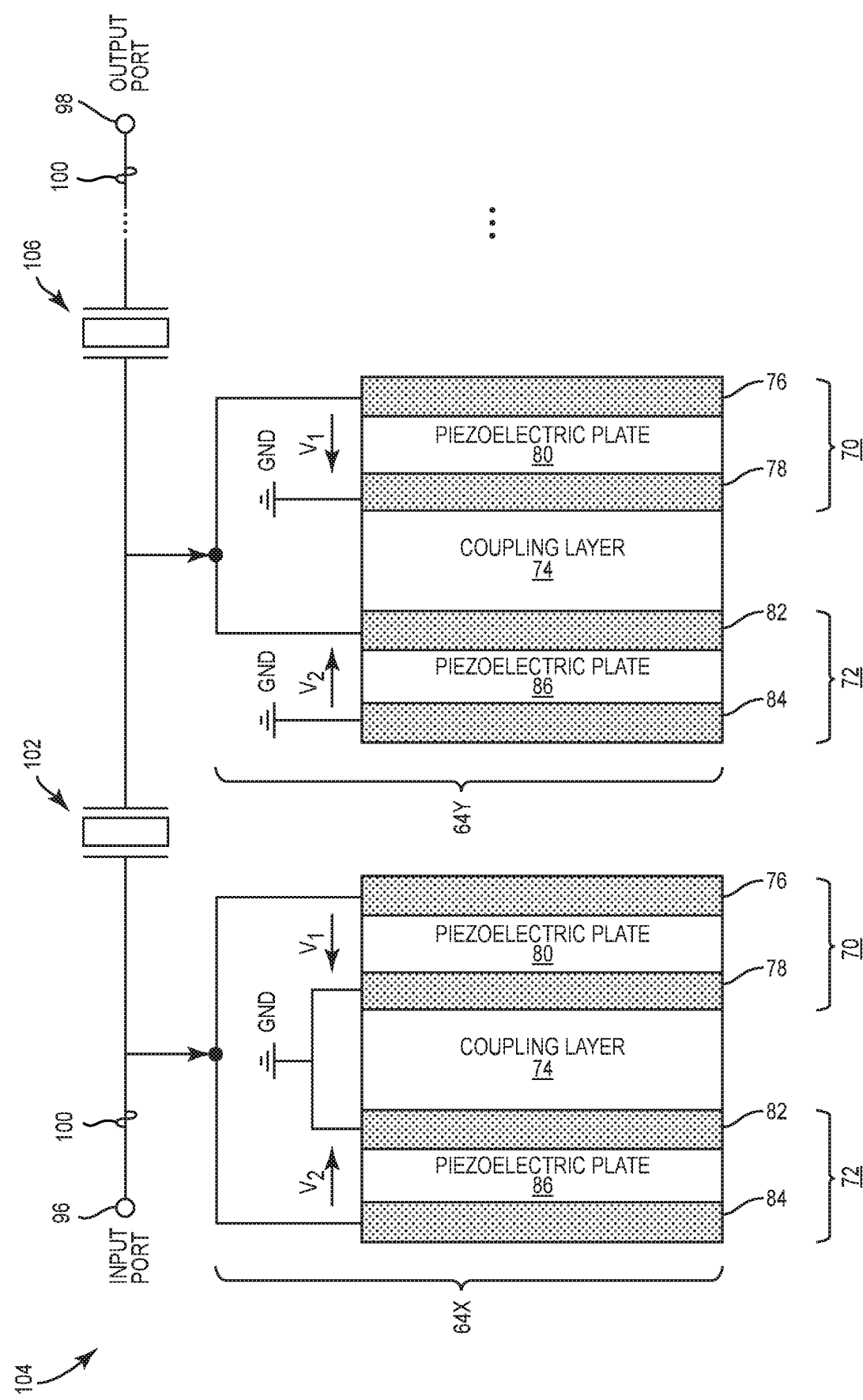
FIG. 6 is a schematic diagram of an exemplary ladder RF filter circuit configured according to another embodiment of the present disclosure to include any of the ZO-CRFs in FIGS. 3 and 4A-4E.

FIG. 6 is a schematic diagram of an exemplary ladder RF filter circuit 104 configured according to an embodiment of the present disclosure to include any of the ZO-CRF 64 of FIG. 3, the ZO-CRF 64A of FIG. 4A, the ZO-CRF 64B of FIG. 4B, the ZO-CRF 64C of FIG. 4C, the ZO-CRF 64D of FIG. 4D, and the ZO-CRF 64E of FIG. 4E. Common elements between FIGS. 5 and 6 are shown therein with common element numbers and will not be re-described herein.

The ladder RF filter circuit 104 includes at least one second ZO-CRF 64Y, which can be any of the ZO-CRF 64 of FIG. 3, the ZO-CRF 64A of FIG. 4A, the ZO-CRF 64B of FIG. 4B, the ZO-CRF 64C of FIG. 4C, the ZO-CRF 64D of FIG. 4D, and the ZO-CRF 64E of FIG. 4E. In a non-limiting example, the ZO-CRF 64X in the ladder RF filter circuit 104 can be configured according to the ZO-CRF 64A of FIG. 4A and the second ZO-CRF 64Y can be configured according to the ZO-CRF 64E of FIG. 4E. The ladder RF filter circuit 104 also includes at least one second series resonator 106 coupled in series with the series resonator 102 between the input port 96 and the output port 98. Similar to the ZO-CRF 64X, the second ZO-CRF 64Y is configured to function as a second shunt resonator in parallel to the ZO-CRF 64X. Accordingly, the first voltage $V_1$ and the second voltage $V_2$ are configured to cause the second ZO-CRF 64Y to resonate at the selected resonance frequency to shunt the RF signal 100 to the GND.

It should be appreciated that the ladder RF filter circuit 104 can be configured to include additional series resonators that are coupled in series with the series resonator 102 and the second series resonator 106 between the input port 96 and the output port 98. Accordingly, the ladder RF filter circuit 104 can be configured to include additional ZO-CRFs provided in parallel to the ZO-CRF 64X and the second ZO-CRF 64Y.

Notably, the ZO-CRF 64X and the second ZO-CRF 64Y can be provided in the ladder RF filter circuit 104 based on an identical configuration. For example, the ZO-CRF 64X and the second ZO-CRF 64Y can be configured according to the ZO-CRF 64A of FIG. 4A, or the ZO-CRF 64B of FIG. 4B, or the CO-CRF 64C of FIG. 4C, or the ZO-CRF 64D of FIG. 4D, or the ZO-CRF 64E of FIG. 4E. Alternatively, it may also be possible to configure the ZO-CRF 64X and the second ZO-CRF 64Y based on different configurations. For example, the ZO-CRF 64X can be configured according to the ZO-CRF 64A of FIG. 4A, or the ZO-CRF 64B of FIG. 4B, or the CO-CRF 64C of FIG. 4C, or the ZO-CRF 64D of FIG. 4D, while the second ZO-CRF 64Y is configured according to the ZO-CRF 64E of FIG. 4E.

Figure 7:
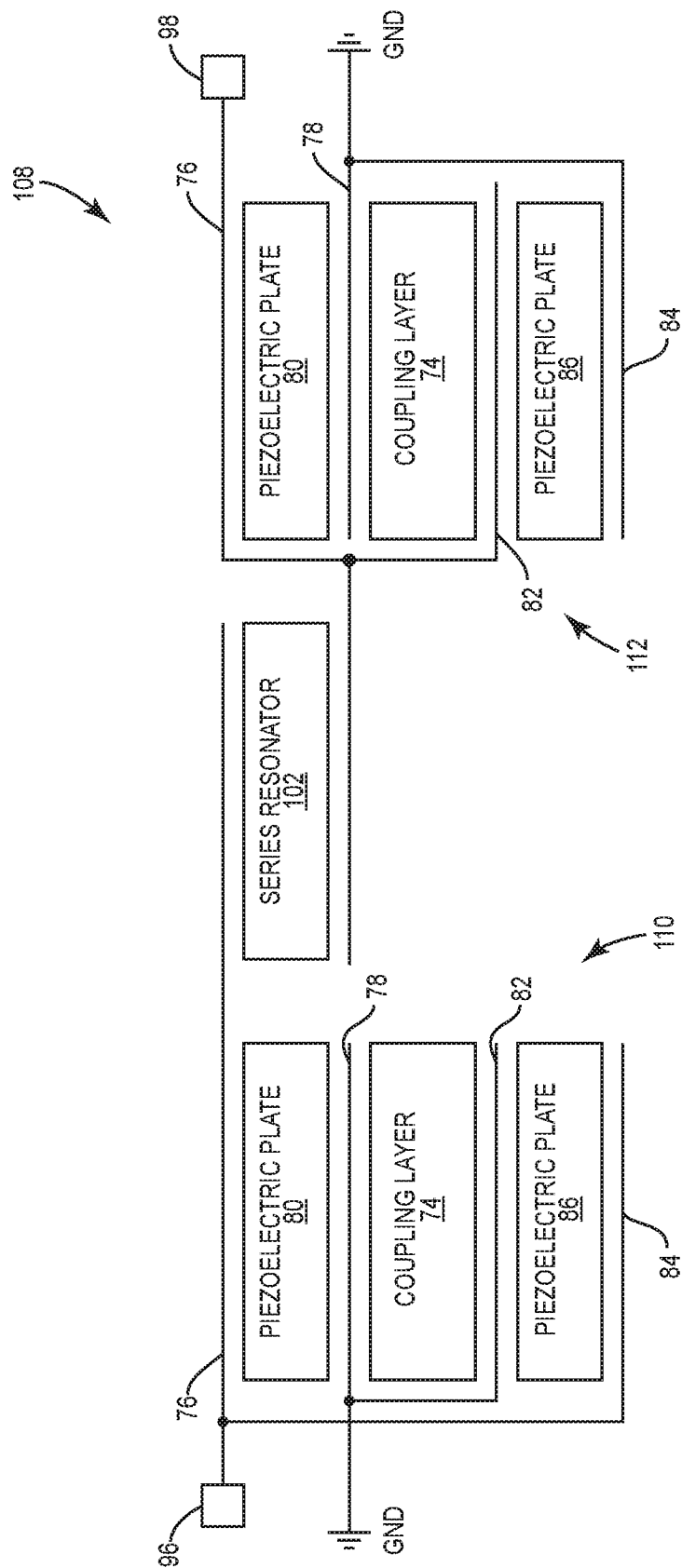
FIG. 7 is a schematic diagram of an exemplary RF filter circuit in which a pair of ZO-CRFs is provided based on different configurations.

In this regard, FIG. 7 is a schematic diagram of an exemplary RF filter circuit 108 in which a first ZO-CRF 110 is configured according to the ZO-CRF 64A of FIG. 4A and a second ZO-CRF 112 is configured according to the ZO-CRF 64E of FIG. 4E. Common elements between FIGS. 6 and 7 are shown therein with common element numbers and will not be re-described herein.

Those skilled in the art will recognize improvements and modifications to the embodiments of the present disclosure. All such improvements and modifications are considered within the scope of the concepts disclosed herein and the claims that follow.

What is claimed is:

1. A zero-output coupled resonator filter (ZO-CRF) comprising:
   a first resonator comprising a first electrode, a second electrode, and a first piezoelectric plate disposed between the first electrode and the second electrode, the first resonator configured to receive a first voltage between the first electrode and the second electrode;
   a second resonator comprising a third electrode, a fourth electrode, and a second piezoelectric plate disposed between the third electrode and the fourth electrode, the second resonator configured to receive a second voltage between the fourth electrode and the third electrode;
   a coupling layer disposed between the second electrode and the third electrode; and
   a tuning element configured to adjust the first voltage and the second voltage based on an input voltage to cause the ZO-CRF to resonate at a selected resonance frequency.

2. The ZO-CRF of claim 1 wherein:
   the first electrode and the fourth electrode are coupled to an input port configured to receive the input voltage; and
   the second electrode and the third electrode are coupled to a ground.

3. The ZO-CRF of claim 2 wherein the first voltage and the second voltage are each configured to equal the input voltage to cause the ZO-CRF to resonate at a single series resonance frequency.

4. The ZO-CRF of claim 2 wherein the first voltage and the second voltage are configured to equal the input voltage and zero, respectively, to cause the ZO-CRF to resonate at a lower series resonance frequency, an upper series resonance frequency, and a parallel resonance frequency between the lower series resonance frequency and the upper series resonance frequency.

5. The ZO-CRF of claim 2 wherein the first voltage and the second voltage are configured to equal zero and the input voltage, respectively, to cause the ZO-CRF to resonate at a lower series resonance frequency, an upper series resonance frequency, and a parallel resonance frequency between the lower series resonance frequency and the upper series resonance frequency.

6. The ZO-CRF of claim 2 wherein the first voltage and the second voltage are configured to equal the input voltage and an inverse of the input voltage, respectively, to cause the ZO-CRF to resonate at a single series resonance frequency.

7. The ZO-CRF of claim 1 wherein:
   the first electrode and the third electrode are coupled to an input port to receive the input voltage; and
   the second electrode and the fourth electrode are coupled to a ground.

8. The ZO-CRF of claim 7 wherein the first voltage and the second voltage are configured to equal the input voltage and an inverse of the input voltage, respectively, to cause the ZO-CRF to resonate at a single series resonance frequency.

9. A radio frequency (RF) filter circuit comprising:
   an input port configured to receive an RF signal;
   an output port configured to output the RF signal;
   a series resonator coupled between the input port and the output port and configured to resonate at a defined resonance frequency to pass the RF signal from the input port to the output port; and
   a zero-output coupled resonator filter (ZO-CRF) coupled between the series resonator and a ground, the ZO-CRF comprises:
      a first resonator comprising a first electrode, a second electrode, and a first piezoelectric plate disposed between the first electrode and the second electrode, the first resonator configured to receive a first voltage between the first electrode and the second electrode;
      a second resonator comprising a third electrode, a fourth electrode, and a second piezoelectric plate disposed between the third electrode and the fourth electrode, the second resonator configured to receive a second voltage between the fourth electrode and the third electrode;
      a coupling layer disposed between the second electrode and the third electrode; and
      at least one tunable element configured to adjust the first voltage and the second voltage based on an input voltage to cause the ZO-CRF to resonate at a selected resonance frequency to shunt the RF signal to the ground.

10. The RF filter circuit of claim 9 wherein:
    the first electrode and the fourth electrode are coupled to the input port and configured to receive the input voltage; and
    the second electrode and the third electrode are coupled to the ground.

11. The RF filter circuit of claim 10 wherein the first voltage and the second voltage are each configured to equal the input voltage to cause the ZO-CRF to resonate at a single series resonance frequency to shunt the RF signal to the ground.

12. The RF filter circuit of claim 10 wherein the first voltage and the second voltage are configured to equal the input voltage and zero, respectively, to cause the ZO-CRF to resonate at a lower series resonance frequency, an upper series resonance frequency, and a parallel resonance frequency between the lower series resonance frequency and the upper series resonance frequency to shunt the RF signal to the ground.

13. The RF filter circuit of claim 10 wherein the first voltage and the second voltage are configured to equal zero and the input voltage, respectively, to cause the ZO-CRF to resonate at a lower series resonance frequency, an upper series resonance frequency, and a parallel resonance frequency between the lower series resonance frequency and the upper series resonance frequency to shunt the RF signal to the ground.

14. The RF filter circuit of claim 10 wherein the first voltage and the second voltage are configured to equal the input voltage and an inverse of the input voltage, respectively, to cause the ZO-CRF to resonate at a single series resonance frequency to shunt the RF signal to the ground.

15. The RF filter circuit of claim 9 wherein:
the first electrode and the third electrode are coupled to the input port to receive the input voltage; and
the second electrode and the fourth electrode are coupled to the ground.

16. The RF filter circuit of claim 15 wherein the first voltage and the second voltage are configured to equal the input voltage and an inverse of the input voltage, respectively, to cause the ZO-CRF to resonate at a single series resonance frequency to shunt the RF signal to the ground.

17. The RF filter circuit of claim 9 further comprising at least one second ZO-CRF coupled between the series resonator and the ground.

18. The RF filter circuit of claim 17 further comprising at least one second series resonator coupled between the series resonator and the output port.

* * * * *

UNITED STATES PATENT AND TRADEMARK OFFICE
CERTIFICATE OF CORRECTION

PATENT NO. : 11,165,412 B2
APPLICATION NO. : 16/358823
DATED : November 2, 2021
INVENTOR(S) : Nadim Khlat and Robert Aigner It is certified that error appears in the above-identified patent and that said Letters Patent is hereby corrected as shown below:

In the Specification

Column 7, Line 6, replace "$V_3 = j*(Lm-L)*w*I_3 - j/(Cm*w)*I_2 + j*L*w*(I_1+I_2)$" with --$V_2 = j*(Lm-L)*w*I_2 - j/(Cm*w)*I_2 + j*L*w*(I_1+I_2)$--.

Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office*